United States Patent [19]

Bleil

[11] 3,729,818

[45] May 1, 1973

[54] SEMICONDUCTIVE CHIP ATTACHMENT MEANS

[75] Inventor: Carl E. Bleil, Birmingham, Mich.

[73] Assignee: General Motors Corporation, Detroit, Mich.

[22] Filed: Oct. 15, 1971

[21] Appl. No.: 189,684

Related U.S. Application Data

[62] Division of Ser. No. 874,516, Nov. 6, 1969.

[52] U.S. Cl. ......................29/630, 264/164, 164/98, 164/46

[51] Int. Cl. ..............................................H01r 9/00

[58] Field of Search...............................29/626, 630; 117/212; 264/164; 164/91, 98, 76, 100

[56] References Cited

UNITED STATES PATENTS 512,713 1/1894 Kennedy ..............................264/164

3,512,051 5/1970 Noll.......................................29/591

3,649,233 3/1972 Battigelli .............................264/164

*Primary Examiner*—Charles W. Lanham

*Assistant Examiner*—W. Tupman

*Attorney*—William S. Pettigrew et al.

[57] ABSTRACT

A method for mounting a semiconductive chip on a substrate, using integral leads, and a method for making the leads. The techniques described are particularly useful in making integral leads on a semiconductive chip which can be flipped onto a complementary conductor network. The leads are preferably formed on the chip while the chip is still part of a slice. The leads are simultaneously formed on the slice by progressive solidification from a melt material, and the slice subsequently diced to form the individual leaded chips.

1 Claim, 7 Drawing Figures

SEMICONDUCTIVE CHIP ATTACHMENT MEANS

RELATED PATENT APPLICATION

This application is a division of United States patent application Ser. No. 874,516 entitled "Semiconductive Chip Attachment Means," filed Nov. 6, 1969, in the name of Carl E. Bleil, and assigned to the assignee of this application.

BACKGROUND OF THE INVENTION

This invention pertains to semiconductors and particularly to the mounting of semiconductive chips on their supporting substrates. More specifically it relates to a means for making contact leads for such chips.

There is a current emphasis on improved techniques for bonding semiconductive chips, particularly those containing monolithic integrated circuits, to a conductive substrate. One particular area of interest involves the formation of terminal leads which are integral with the chip itself. To mount the leaded chip, it is merely flipped onto a support having complementary contact regions. The leads can then be bonded in place to interconnect them with the substrate contact regions. In this type of mounting, the leads space the face of the chip from the substrate, provide terminal connections for the chip, and secure the chip in place.

SUMMARY OF THE INVENTION

It is a principal object of the invention to provide a novel technique for making contact leads for semiconductive chips, particularly monolithic circuit chips.

Another object of the invention is to provide a method for producing integral contact leads on chips which are to be flipped onto a substrate having appropriate matching contact regions.

Still another object of the invention is to provide an improved means for bonding leaded chips to a complementary substrate.

These and other objects of the invention are attained by growing contact spires onto either a semiconductive chip or the matching complementary regions of the support to which the chip is to be bonded. The contact spires are grown by placing an appropriately prepared surface of the chip or the substrate in contact with a metal melt, removing heat from the chip to cause progressive solidification of the melt onto selected regions of the surface, and slowly withdrawing the chip or substrate from the melt at a rate commensurate with the rate of melt precipitation on the selected areas. In this manner the spires are grown on the substrate or the chip to any desired height. Thereafter, the element having the spires is placed in contact with its complementary element and the two bonded together at a temperature below the melting temperature of the spires.

BRIEF DESCRIPTION OF THE DRAWING

Other objects, features and advantages of the invention will become more apparent from the following description of preferred embodiments thereof and from the drawing, in which.

DESCRIPTION OF THE PREFERRED EMBODIMENTS

As previously indicated, this invention involves the formation of contact spires as chip terminal leads. While I prefer to form the contact spires on the chip itself, it should be recognized that they can also be formed on the substrate instead. In fact, in some applications it may be preferred to merely make contact leads on the chip and from the contact spires on the substrate itself. As in the prior art leads, my contact spires space the chip from the substrate, provide terminal leads for the chip, and hold the chip in place.

Figure 1:
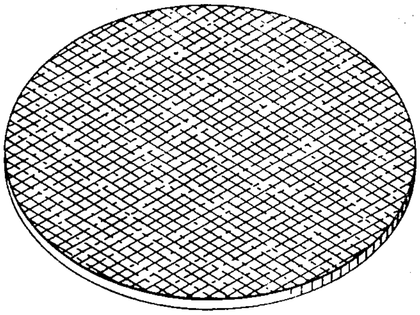
FIG. 1 shows an isometric view of a semiconductive slice containing a plurality of discrete transistor regions.
Figure 2:
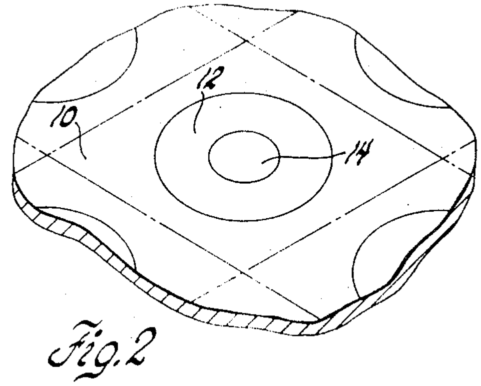
FIG. 2 shows an enlarged fragmentary view of one of the transistor regions shown in FIG. 1.

For a description of how the contact spires are produced on the chip itself, reference is now made to the drawing. FIG. 1 shows a germanium slice having a plurality of discrete transistor regions thereon, such as shown in FIG. 2. The slices of germanium and the individual transistor regions are produced by appropriate doping, as by diffusion, to form collector region 10, base region 12 and emitter region 14.

Figure 3:
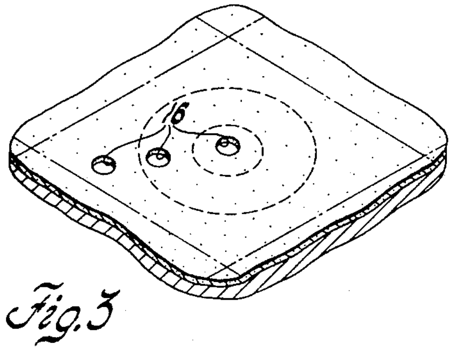
FIGS. 3 – 5 show progressive stages in preparing the surface of the slice in order to form contact spires.
Figure 4:
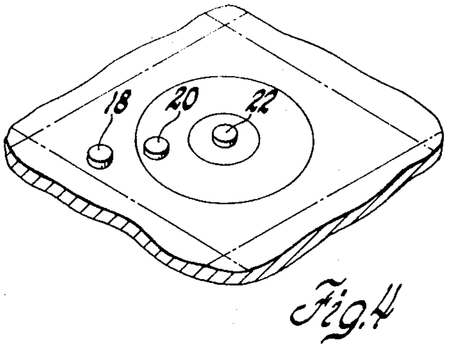
Figure 5:
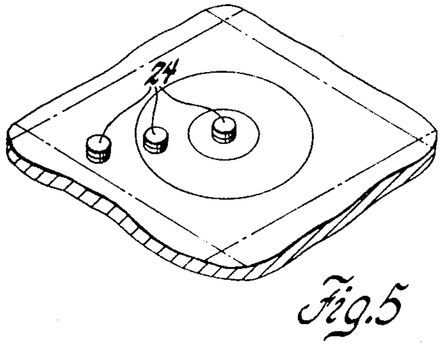
Figure 6:
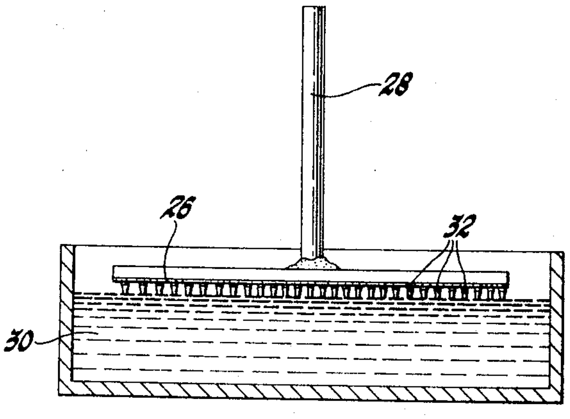
FIG. 6 illustrates the growing of contact spires on the slice.
Figure 7:
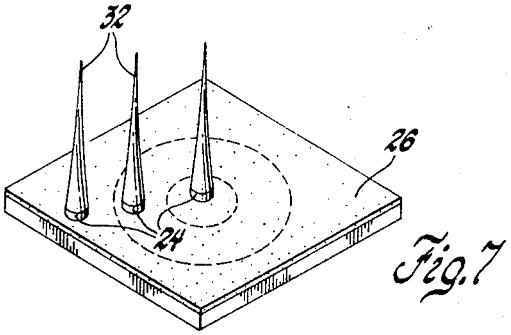
FIG. 7 is an isometric view showing a semiconductive chip having contact spires thereon.

As shown in FIGS. 3 – 5, the germanium slice is coated with a photoresist and windows 16 opened in it over each of the respective transistor regions. An aluminum coating is then evaporated onto the photoresist, and the photoresist removed leaving aluminum contacts 18, 20 and 22 formed on the collector base and emitter regions, respectively. With similar masking techniques a layer of gold 24 is subsequently formed on the surface of each aluminum contact. This gold layer is to form a base upon which each contact spire is to be grown.

A silicone oil or silicon dioxide coating 26 is then applied to the entire surface of the slice, except for the surface of the gold layer 24 on each aluminum contact. In this manner the entire surface of the slice is masked except for the gold surface coating on each aluminum contact.

Thereafter, the back of the slice is attached to an appropriate support 28 and the slice is inverted over the surface of a melt 30 of spire material. In this embodiment the melt can be of bismuth and is maintained at a temperature of approximately 273° C. The surface of the slice is maintained parallel the surface of the melt and is lowered into contact with it.

Heat will radiate from the slice, as well as from its support, causing the melt to precipitate onto the exposed gold covered contact pads. The slice is then withdrawn from the melt, at a rate commensurate with the rate of precipitation to progressively grow contact spires 32 onto the gold layers. During the slow withdrawal the slice should be maintained parallel the surface of the melt to insure a uniform spire growth on all regions of the surface. If it is not perfectly parallel the spires formed on that part of the slice surface closest to the melt will be shorter than those on the slice surface region further away from the melt.

After the contact spires are grown to approximately 0.002 inch, the slice is simply raised more rapidly to separate it from the melt.

The spires are at this point completely formed, and the slice diced to release each completed chip ready to mount on its own particular substrate. Dicing can be performed in the normal and accepted manner.

Any suitable maskant can be used to form the aluminum contacts for the various transistor regions in the slice, as this forms no part of this invention. In addition, while aluminum is a convenient contact metal to be used, it is recognized that other contact metals can be employed, as for example nickel, gold or titanium-aluminum alloys. In addition, the contacts need not be made as shown in the drawing. The drawing shows the contacts wholly within the regions they make electrical contact to, with the spires formed directly above these regions. It is to be recognized that one might prefer to use an over-the-oxide bridge to locate the spire wherever one desires on the chip surface. In such instance, the electrode contacting the semi-conductor region would pass up through a window in a passivating oxide coating, and extend over the passivating coating to some remote corner of the chip. For example, it might be desired to equally distribute the contact spires on the surface of the chip by this technique to stabilize the chip better when it is mounted. In a monolithic circuit one may use this technique to simply obtain greater separation between the contact spires.

It should also be noted that it may not be necessary to use any special base layer on the contact pad as a selective site upon which to form the spire. However, the base layer is desirable if the spire material has a propensity to react with or dissolve the contact metal at spire growth temperatures. In addition, the spire material should adequately wet the region where it is to be grown. Aluminum, unless cleaned properly, may provide some wetting difficulties. Suitable wetting can be assured if the aluminum is coated with gold before the spire is grown. The normal vacuum deposition techniques will adequately clean the aluminum to form an adherent gold coating on the aluminum. Most materials will wet gold, particularly those which are hereinafter described. Obviously then the gold coating need not be of any appreciable thickness when it merely provides a surface which the spire material will wet. As a barrier layer to prevent any spire-contact chemical interaction, somewhat thicker coatings may be desired.

The slice can be masked for spire growth in any convenient manner. Silicone oil or grease will serve this purpose, as well as a coating of silicon dioxide.

The contact material and the spire base layer should melt at a temperature higher than that of the spire material itself. Analogously, the spire material should melt at a temperature higher than the chip bonding temperature. The following are suitable alloys which can be used as spire materials for germanium or silicon semiconductive devices having nickel, titanium-aluminum or aluminum contacts, preferably with a gold spire base layer:

| Composition | | Melt Point |
|---|---|---|
| 95% gold | 5% silicon | 400° C. |
| 35% silver | 65% indium | 400° C. |
| 45% aluminum | 55% germanium | 425° C. |
| 5% aluminum | 95% zinc | 380° C. |
| 40% gold | 60% bismuth | 425° C. |
| 88% gold | 12% germanium | 356° C. |
| 50% gold | 50% lead | 410° C. |
| 75% gold | 25% antimony | 360° C. |
| 60% gold | 40% tin | 300° C. |

In general one would desire a spire material melting at a temperature of 300° C. to 450° C. for silicon and particularly for germanium. If, however, one were to employ this technique with higher melting point semiconductors, such as silicon carbide, spire materials having higher melting point temperatures can be used. Analogously, semiconductors having lower melting point temperatures, such as gallium arsenide, would require spires having lower melting point temperatures, since the gallium arsenide itself melts at a fairly low temperature.

Chips having spires formed thereon in accordance with this invention can be secured to any appropriate substrate pads in any of the usual manners. However, it should be appreciated that the spires of this invention are used to maintain a spacing between the active surface regions of the chip and the various contact pads on the substrate supporting the chip. Consequently, the bonding operation must not involve sufficient heat to melt the spires. Accordingly, the chips made in accordance with the invention can be bonded by any of the conventional techniques, such as ultrasonic bonding, thermocompression bonding, and soldering. The solder, of course, should melt at a lower temperature than the spire material. Solders such as 55.5 percent bismuth and 44.5 percent lead, melting at 124° C., and 63 percent tin and 37 percent lead, melting at 183° C., can be used. Also, there are a variety of other lead-tin solders which can be used.

To solder a chip in place, once the chip has the contact spires formed on it, one need only precoat the contact region of the substrate with solder, invert the chip and register the spires on their respective contact pads. The assembly is then heated to above the melting point temperature of the solder, and then cooled, to bond the chip to the substrate.

It is to be noted that my invention produces a rather uniform spire height when performed in accordance with the invention, even when there are several hundred active devices on a given slice. Deviation in spire height between the spires of any particular device region on the slice is normally very small, and normally does not present any difficulty. Any conventional solder layer thickness would be in excess of the maximum deviation in spire height on any chip. However, in some instances the spire deviation may be more excessive. In such instance the solder thickness should be increased to insure that all spires will be contacting the solder when the chip is bonded to the substrate. In this way an increased solder thickness compensates for the increased deviation in spire height. On the other hand, if spire height is not sufficiently uniform one can simply flat polish the face of the slice to produce a uniform spire height.

Although this invention has been described in connection with certain specific examples thereof no limitation is intended thereby except as defined in the appended claims.

I claim:

1. The method of forming integral contact leads on a semiconductive chip having at least one semiconductor device formed therein, said method comprising the steps of forming an electrode member on the surface of said chip for contacting at least one region of said device, masking said chip except for a selected portion of said electrode, preparing the exposed surface of said electrode to receive a contact spire, placing said masked chip in contact with a melt of spire material, progressively withdrawing said chip from said melt while concurrently removing heat from the chip to progressively precipitate melt material on said selected portions and thereby progressively form a contact spire on the surface of the chip.

* * * * *